(12) United States Patent
Lee

(10) Patent No.: US 11,087,856 B2
(45) Date of Patent: Aug. 10, 2021

(54) MEMORY SYSTEM AND OPERATING METHOD THEREOF

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 114 days.

(21) Appl. No.: 16/368,087

(22) Filed: Mar. 28, 2019

(65) Prior Publication Data

US 2020/0090778 A1   Mar. 19, 2020

(30) Foreign Application Priority Data

Sep. 17, 2018   (KR) .......................... 10-2018-0110929

(51) Int. Cl.
| | |
|---|---|
| *G11C 29/04* | (2006.01) |
| *G06K 9/62* | (2006.01) |
| *G06F 11/20* | (2006.01) |
| *G06F 11/14* | (2006.01) |

(52) U.S. Cl.
CPC .......... *G11C 29/04* (2013.01); *G06F 11/1438* (2013.01); *G06F 11/1458* (2013.01); *G06F 11/2023* (2013.01); *G06K 9/628* (2013.01); *G11C 2029/0407* (2013.01)

(58) Field of Classification Search
CPC ............ G11C 29/04; G11C 2029/0407; G06F 11/1438; G06F 11/1458; G06F 11/2023
See application file for complete search history.

(56) References Cited

U.S. PATENT DOCUMENTS

| | | | |
|---|---|---|---|
| 2009/0150599 A1 | 6/2009 | Bennett | |
| 2011/0113208 A1 | 5/2011 | Jouppi | |
| 2014/0095437 A1* | 4/2014 | Hwang | ............... G06F 11/1469 707/634 |
| 2015/0186042 A1* | 7/2015 | Lee | ........................ G11C 16/32 711/103 |

\* cited by examiner

*Primary Examiner* — Mohammed A Bashar
(74) *Attorney, Agent, or Firm* — IP & T Group LLP

(57) ABSTRACT

A memory system includes: a memory device including a plurality of memory blocks; a memory; a data classifier suitable for classifying check-pointing information stored in the memory as selective information and mandatory information; and a check-pointing component suitable for performing a control to periodically perform a check-pointing operation of programming the selective information and the mandatory information in a memory block, wherein the check-pointing component performs the check-pointing operation by performing a control to program the mandatory information after programming the selective information.

19 Claims, 21 Drawing Sheets

MEMORY SYSTEM AND OPERATING METHOD THEREOF

CROSS-REFERENCE TO RELATED APPLICATION

The present application claims priority of Korean Patent Application No. 10-2018-0110929, filed on Sep. 17, 2018, which is incorporated herein by reference in its entirety.

BACKGROUND

1. Field

Various embodiments of the present invention relate to a memory system, and more particularly, to a memory system capable of efficiently performing a check-pointing operation and a method for operating the memory system.

2. Description of the Related Art

The computer environment paradigm has shifted to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption, since they have no moving parts, as compared with a hard disk device. Examples of memory systems having such advantages include universal serial bus (USB) memory devices, memory cards having various interfaces, and solid state drives (SSD).

SUMMARY

Embodiments of the present invention are directed to a memory system that performs a check-pointing operation by classifying check-pointing information into selective information and mandatory information.

In accordance with an embodiment of the present invention, a memory system includes: a memory device including a plurality of memory blocks; a memory; a data classifier suitable for classifying check-pointing information stored in the memory as selective information and mandatory information; and a check-pointing component suitable for controlling the memory device to periodically perform a check-pointing operation of programming the selective information and the mandatory information in a memory block, wherein the check-pointing component controls the memory device to perform the check-pointing operation by performing a control to program the mandatory information after programming the selective information.

In accordance with another embodiment of the present invention, a method for operating a memory system includes: classifying check-pointing information stored in a memory into selective information and mandatory information; and periodically performing a check-pointing operation of programming the selective information and the mandatory information in a memory block, wherein the check-pointing operation is performed by programming the mandatory information after programming the selection information.

In accordance with another embodiment of the present invention, a memory system includes: a memory device; and a controller suitable for: controlling the memory device to periodically perform a check-pointing operation of first storing selective information and then storing mandatory information; and controlling, when a sudden power off occurs, the memory device to read most recently stored mandatory information and then resume an operation, which was interrupted due to the sudden power off, by reading the selective information according to the read mandatory information.

DETAILED DESCRIPTION

Figure 1:
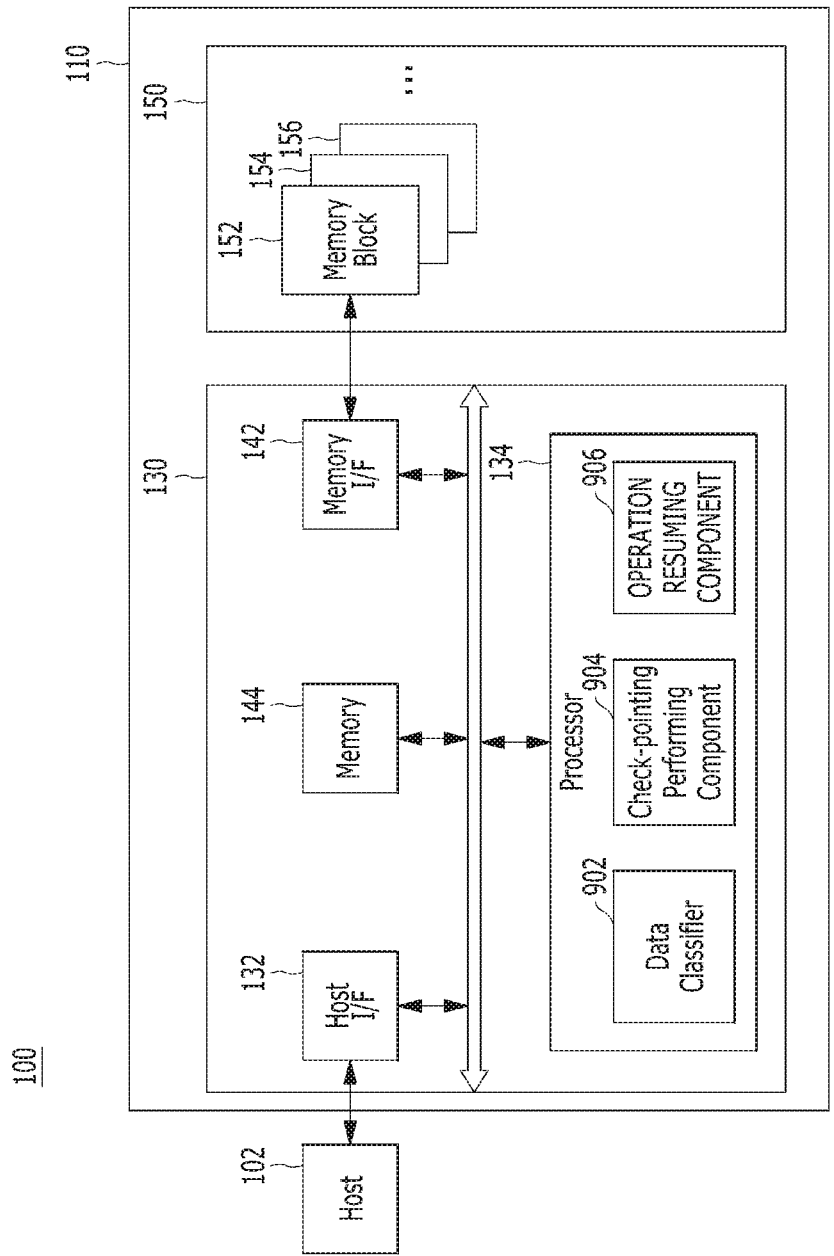
FIG. 1 is a block diagram illustrating a data processing system including a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first" and/or "second" may be used herein to describe various elements, these elements should not be limited by these terms. These terms are only used to distinguish one element from another element that otherwise have the same or similar names. For instance, a first element in one instance could be termed a second element in another instance, and vice versa, without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms and vice versa, unless the context clearly indicates otherwise. The articles 'a' and 'an' as used in this application and the appended claims should generally be construed to mean 'one or more' unless specified otherwise or clear from context to be directed to a singular form. It will be further understood that the terms "comprise", "include", "have", and other open-ended transitional terms, when used in this specification, specify the presence of stated features, numbers, steps, operations, elements, components, and/or combinations of them but do not preclude the presence or addition of one or more other features, numbers, steps, operations, elements, components, and/or combinations thereof.

The above-described embodiments are merely for the purpose of understanding the present disclosure; the scope of the present disclosure should not be limited to the above-described embodiments. Various modifications based on the technical spirit of the present disclosure may be made, as those skilled in the art will understand in light of the present disclosure, and such modifications are intended to be part of the present invention.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

Various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include any of a variety of portable electronic devices such as a mobile phone, a MP3 player and a laptop computer, or any of a variety of non-portable electronic devices such as a desktop computer, a game machine, a TV and a projector.

The host 102 may include at least one OS (operating system) or a plurality of operating systems. The host 102 may execute an OS to perform an operation corresponding to a user's request on the memory system 110. Here, the host 102 may provide a plurality of commands corresponding to a user's request to the memory system 110. Thus, the memory system 110 may perform certain operations corresponding to the plurality of commands, that is, corresponding to the user's request. The OS may manage and control overall functions and operations of the host 102. The OS may support an operation between the host 102 and a user using the data processing system 100 or the memory system 110.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of the memory system 110 include a solid state drive (SSD), a multi-media card (MMC) and an embedded MMC (eMMC).

The memory system 110 may include various types of storage devices. Non-limiting examples of such storage devices include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory.

The memory system 110 may include a memory device 150 and a controller 130.

The controller 130 and the memory device 150 may be integrated into a single semiconductor device, which may be included in any of the various types of memory systems as described above. For example, the controller 130 and the memory device 150 may be integrated as a single semiconductor device to constitute an SSD, a PCMCIA (personal computer memory card international association) card, SD card including a mini-SD, a micro-SD and a SDHC, and an UFS device. The memory system 110 may be configured as a part of a computer, a smart phone, a portable game player, or one of various components configuring a computing system.

The memory device 150 may be a nonvolatile memory device which may retain stored data even though power is not supplied. The memory device 150 may store data provided from the host 102 through a write operation, and output data stored therein to the host 102 through a read operation. In an embodiment, the memory device 150 may include a plurality of memory dies (not shown), and each memory die may include a plurality of planes (not shown). Each plane may include a plurality of memory blocks 152 to 156, each of which may include a plurality of pages, each of which may include a plurality of memory cells coupled to a word line. In an embodiment, the memory device 150 may be a flash memory having a 3-dimensional (3D) stack structure.

The structure of the memory device 150 including a three-dimensional stack structure thereof will be described later in more detail with reference to FIGS. 12 to 14.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

More specifically, the controller 130 may include a host interface (I/F) 132, a processor 134, a memory interface 142, and a memory 144, all operatively coupled or engaged via an internal bus. As described later with reference to FIG. 9, the processor 134 may include a data classifier 902, a check-pointing component 904, and an operation resuming component 906.

The host interface 132 may process a command and data of the host 102. The host interface 132 may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE). The host interface 132 may be driven via firmware, that is, a host interface layer (NIL) for exchanging data with the host 102.

The memory interface 142 may serve as a memory/storage interface between the controller 130 and the memory device 150 such that the controller 130 may control the memory device 150 in response to a request from the host 102.

The memory 144 may serve as a working memory of the memory system 110 and the controller 130, and store data for driving the memory system 110 and the controller 130.

The memory 144 may be a volatile memory. For example, the memory 144 may be a static random access memory (SRAM) or dynamic random access memory (DRAM). The memory 144 may be disposed within or external to the controller 130. FIG. 1 shows the memory 144 disposed within the controller 130. In an embodiment, the memory 144 may be an external volatile memory having a memory interface for transferring data between the memory 144 and the controller 130.

As described above, the memory 144 may include a program memory, a data memory, a write buffer/cache, a read buffer/cache, a data buffer/cache and a map buffer/cache to store some data required to perform data write and read operations between the host 102 and the memory device 150 and other data required for the controller 130 and the memory device 150 to perform these operations.

The processor 134 may control overall operations of the memory system 110. The processor 134 may use firmware to control the overall operations of the memory system 110. The firmware may be referred to as flash translation layer (FTL). The processor 134 may be implemented with a microprocessor or a central processing unit (CPU).

For example, the controller 130 may perform an operation requested by the host 102 in the memory device 150 through the processor 134, which is implemented as a microprocessor, a CPU, or the like. Also, the controller 130 may perform a background operation on the memory device 150 through the processor 134, which may be realized as a microprocessor or a CPU. The background operation performed on the memory device 150 may include an operation of copying and processing data stored in some memory blocks among the memory blocks 152 to 156 of the memory device 150 into other memory blocks, e.g., a garbage collection (GC) operation, an operation of swapping data between select memory blocks of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156 in the memory device 150.

Figure 2:
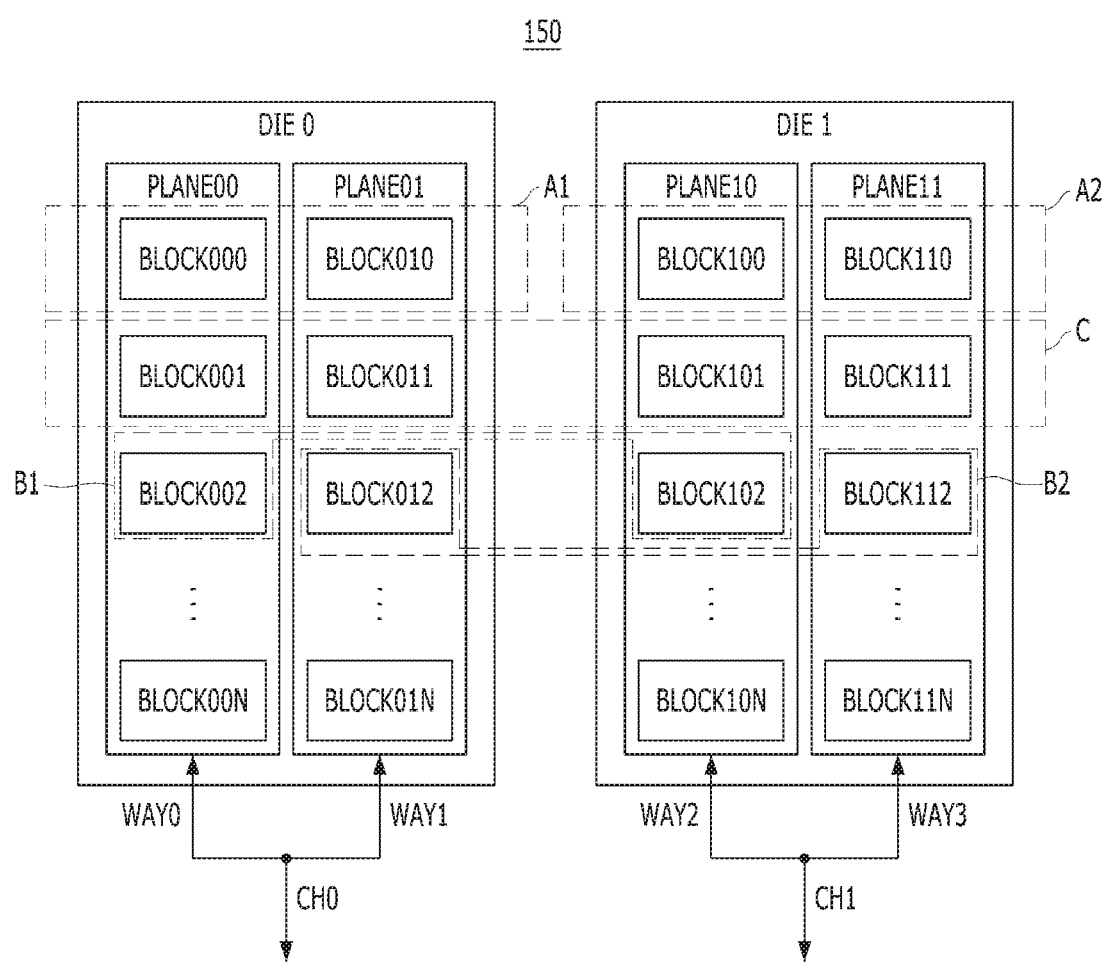
FIG. 2 is a block diagram illustrating a super memory block which is used in a memory system in accordance with an embodiment of the present invention.

FIG. 2 is a diagram illustrating a super memory block used in a memory system in accordance with an embodiment of the present invention.

FIG. 2 illustrates in detail constituent elements of the memory device 150 shown in FIG. 1 in accordance with an embodiment of the present invention.

The memory device 150 may include a plurality of memory blocks BLOCK000 to BLOCK00N, BLOCK010 to BLOCK01N, BLOCK100 to BLOCK10N, and BLOCK110 to BLOCK11N.

In addition, the memory device 150 may include a first memory die DIE0 capable of inputting/outputting data through a zeroth channel CH0 and a second memory die DIE1 capable of inputting/outputting data through a first channel CH1. The zeroth and first channels CH0 and CH1 may input/output data in an interleaving scheme.

The first memory die DIE0 may include a plurality of planes PLANE00 and PLANE01 respectively corresponding to a plurality of ways WAY0 and WAY1. The ways WAY0 and WAY1 may input/output data in the interleaving scheme by sharing the zeroth channel CH0.

The second memory die DIE1 may include a plurality of planes PLANE 10 and PLANE 11 respectively corresponding to a plurality of ways WAY2 and WAY3. The ways WAY2 and WAY3 may input/output data in the interleaving scheme by sharing the first channel CH1.

The first plane PLANE00 of the first memory die DIE0 may include a set number of memory blocks, e.g., BLOCK000 to BLOCK00N, among the plurality of memory blocks in the memory device 150.

The second plane PLANE01 of the first memory die DIE0 may include a set number of memory blocks, e.g., BLOCK010 to BLOCK01N, among the plurality of memory blocks in the memory device 150.

The first plane PLANE10 of the second memory die DIE1 may include a set number of memory blocks, e.g., BLOCK100 to BLOCK10N, among the plurality of memory blocks in the memory device 150.

The second plane PLANE11 of the second memory die DIE1 may include a set number of memory blocks, e.g., BLOCK110 to BLOCK11N, among the plurality of memory blocks in the memory device 150.

In this manner, the plurality of memory blocks in the memory device 150 may be divided into groups, according to their physical locations and their use of the ways and channels.

Although it is described in connection with the illustrated embodiment of the present invention that two memory dies DIE0 and DIE1 are included in the memory device 150, and two planes PLANE00 and PLANE01/PLANE10 and PLANE11 are included in the respective memory dies DIE0 and DIE1, the present disclosure is not limited in this way. In other embodiments, more or less than two memory dies may be included in the memory device 150, and more or less than two planes may be included in the respective memory dies, according to system design considerations. The number of memory blocks included in the respective planes may be also adjusted variously according to such design considerations.

Instead of dividing the plurality of memory blocks in the memory device 150 based on their physical locations such as the memory dies DIE0 and DIE1 or the planes PLANE00 and PLANE01 PLANE10 and PLANE11, the controller 130 may divide the plurality of memory blocks on a basis of which memory blocks are simultaneously selected and operated. In other words, the controller 130 may manage a plurality of memory blocks which are located in different dies or different planes based on their physical locations, by grouping memory blocks capable of being selected simultaneously and thereby dividing the grouped memory blocks into super memory blocks.

The simultaneous selection scheme of grouping the memory blocks into super memory blocks by the controller 130 may be performed in various ways according to system design considerations. Herein, three simultaneous selection schemes will be exemplified as follows.

A first scheme is to group an arbitrary memory block BLOCK000 from the first plane PLANE00 and an arbitrary memory block BLOCK010 from the second plane PLANE01 of the first memory die DIE0 and manage the grouped memory blocks BLOCK000 and BLOCK010 as a single super memory block A1. When the first way is applied to the second memory die DIE1, the controller 130 may group an arbitrary memory block BLOCK100 from the first plane PLANE10 and an arbitrary memory block BLOCK110 from the second plane PLANE11 of the second memory die DIE1 and manage the grouped memory blocks BLOCK100 and BLOCK110 as a single super memory block A2.

A second scheme is to group an arbitrary memory block BLOCK002 from the first plane PLANE00 of the first memory die DIE0 and an arbitrary memory block BLOCK102 from the first plane PLANE10 of the second memory die DIE1 and manage the grouped memory blocks BLOCK002 and BLOCK102 as a single super memory block B1. In addition, according to the second way, the controller 130 may group an arbitrary memory block BLOCK012 from the second plane PLANE01 of the first memory die DIE0 and an arbitrary memory block BLOCK112 from the second plane PLANE11 of the second memory die DIE1 and manage the grouped memory blocks BLOCK012 and BLOCK112 as a single super memory block B2.

A third scheme is to group an arbitrary memory block BLOCK001 from the first plane PLANE00 of the first memory die DIE0, an arbitrary memory block BLOCK011 from the second plane PLANE01 of the first memory die DIE0, an arbitrary memory block BLOCK101 from the first plane PLANE10 of the second memory die DIE1, and an arbitrary memory block BLOCK111 from the second plane PLANE11 of the second memory die DIE1 and manage the grouped memory blocks BLOCK001, BLOCK011, BLOCK101 and BLOCK111 as a single super memory block C.

The simultaneously-selectable memory blocks included in the respective super memory blocks may be substantially simultaneously selected by the controller 130 through an interleaving scheme, for example, a channel interleaving scheme, a memory die interleaving scheme, a memory chip interleaving scheme or a way interleaving scheme.

Figure 3:
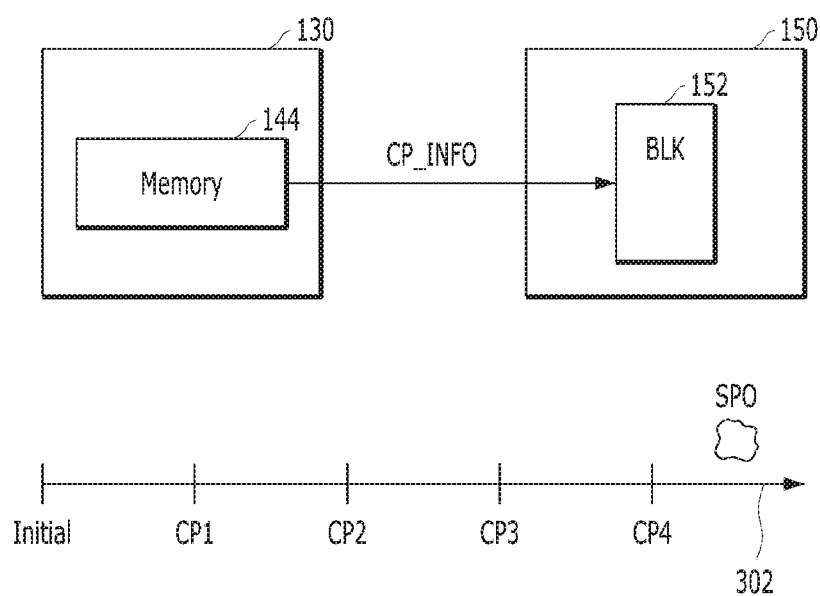
FIG. 3 is a block diagram illustrating a check-pointing operation.

FIG. 3 is a block diagram illustrating a check-pointing operation.

The memory device 150 may perform a check-pointing operation of periodically programming check-pointing information CP_INFO stored in the memory 144 into a memory block 152 under the control of the controller 130. The check-pointing information CP_INFO may be data for the memory system 110 to perform a background operation described above with reference to FIG. 1 or an operation according to a request from the host 102. When the power supply is cut off due to the occurrence of a specific event, such as sudden power-off, the memory device 150 may resume, based on the check-pointing information stored in the memory block 152, an operation interrupted due to the sudden power-off. Therefore, the controller 130 may not need to restart the interrupted operation from the beginning but may resume the interrupted operation based on the most recently stored valid check-pointing information CP_INFO starting from the time of the sudden power-off. For example, the controller 130 may control the memory device 150 to read the most recently stored valid check-pointing information CP_INFO and load the check-pointing information CP_INFO into the memory 144 after the sudden power-off. The controller 130 may control the memory device 150 to resume the interrupted operation based on the loaded check-pointing information CP_INFO.

As illustrated in the time line 302 of FIG. 3, the memory device 150 may periodically perform a check-pointing operation under the control of the controller 130. For example, the memory device 150 may perform a check-pointing operation under the control of the controller 130 at first to fourth check-pointing times CP1 to CP4. When the sudden power-off occurs after the fourth check-pointing time CP4, the controller 130 may control the memory device 150 to read the check-pointing information CP_INFO, which is check-pointed at the fourth check-pointing time CP4, from the memory block 152 and resume the interrupted operation based on the check-pointing information CP_INFO of the fourth check-pointing time CP4. Therefore, as the controller 130 controls the memory device 150 to perform a check-pointing operation, even through the sudden power-off occurs, the controller 130 may control the memory device 150 not to restart the interrupted operation from the beginning but to resume the interrupted operation based on the check-pointing information CP_INFO of the fourth check-pointing time CP4, which is right before the sudden power-off occurs.

Figure 4:
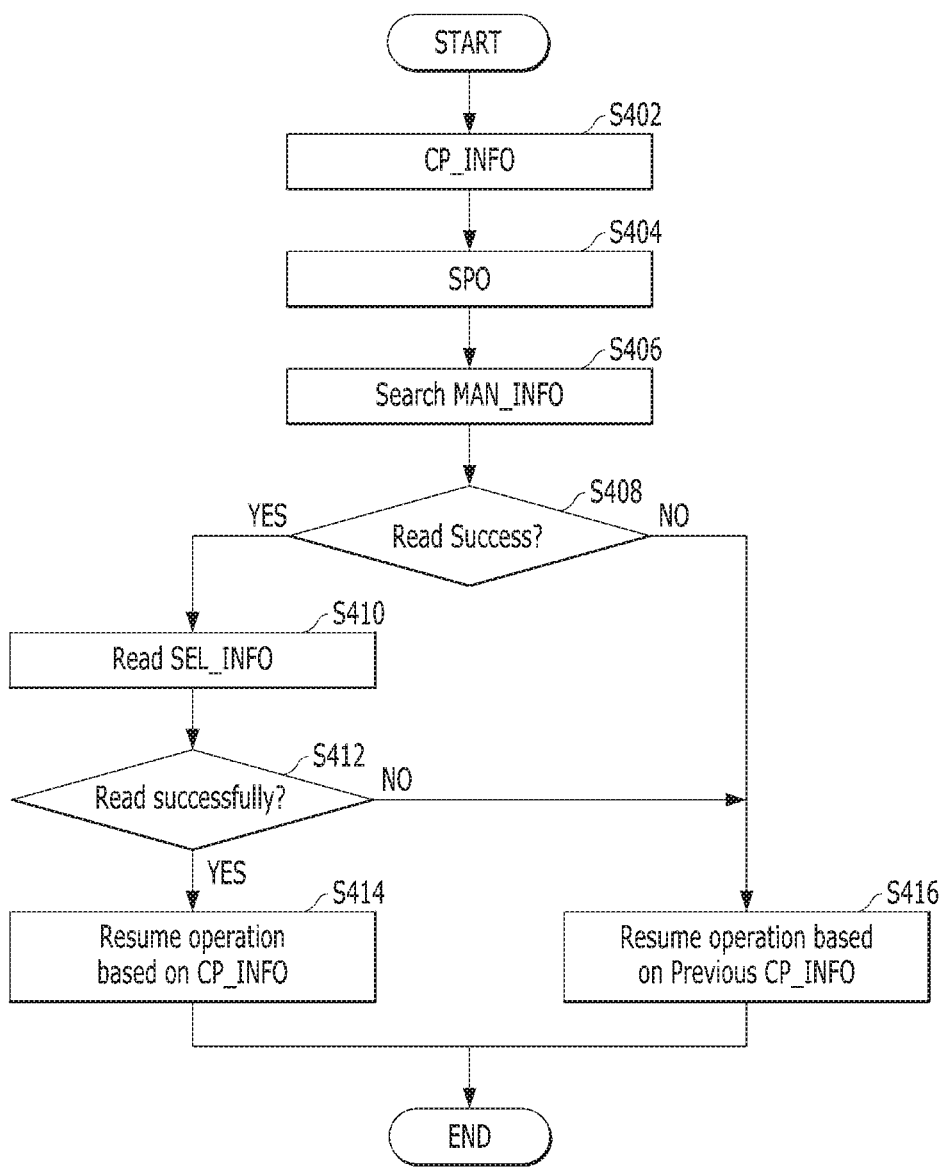
FIG. 4 is a flowchart describing a check-pointing operation according to prior art.

FIG. 4 is a flowchart describing a check-pointing operation according to a prior art.

In step S402, the controller 130 may control the memory device 150 to periodically perform a check-pointing operation. The controller 130 may provide the memory device 150 with the check-pointing information CP_INFO stored in the memory 144 at each of multiple check-pointing times. The memory device 150 may program the provided check-pointing information CP_INFO into a memory block. The check-pointing information CP_INFO may include selective information SEL_INFO and mandatory information MAN_INFO. The selective information SEL_INFO may be data that is required for performing a background operation or an operation according to a request of the host 102, and the mandatory information MAN_INFO may be map information of the selective information SEL_INFO. The map information may be L2P (Logical to Physical) information including physical address corresponding to logical address of the selective information SEL_INFO. The memory device 150 may store, in the memory block storing check-pointing information CP_INFO, identifiers for distinguishing selective information SEL_INFO and mandatory information MAN_INFO from each other. For example, the memory device 150 may program identifier and corresponding mandatory information MAN_INFO or selective information SEL_INFO in the same page. The memory device 150 may distinguish the mandatory information MAN_INFO from the selective information SEL_INFO during resuming operation of the interrupted operation by using the stored identifiers in each of the pages. According to the prior art, when performing check-pointing, the memory device 150 may program the selective information SEL_INFO and mandatory information MAN_INFO in random order.

Figure 5:
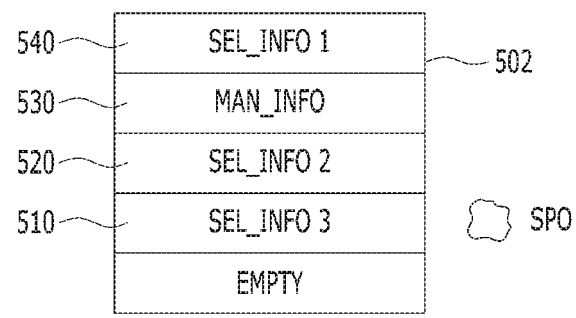
FIG. 5 illustrates a memory block for describing the check-pointing operation according to prior art.

FIG. 5 illustrates a memory block for describing the check-pointing operation according to the prior art.

In the present context, it is assumed that the check-pointing information CP_INFO includes first to third selective information SEL_INFO1 to SEL_INFO3 and mandatory information MAN_INFO.

According to the prior art, the memory device 150 may perform a check-pointing operation by programming the first to third selective information SEL_INFO1 to SEL_INFO3 and the mandatory information MAN_INFO in the memory block 502 in random order. The memory block 502 shown in FIG. 5 may be programmed in the order of the first selective information SEL_INFO1, the mandatory information MAN_INFO, the second selective information SEL_INFO2, and the third selective information SEL_INFO3.

Referring back to FIG. 4, in step S404, the controller 130 may sense sudden power-off. When the sudden power-off occurs, the check-pointing information CP_INFO stored in the volatile memory 144 is lost and hence not available when the power supply is resumed. On the other hand, the check-pointing information CP_INFO stored in the non-volatile memory block 502 may be retained even after the power supply is resumed.

In step S406, the controller 130 may search for and retrieve the mandatory information MAN_INFO stored in the memory block 502. This mandatory information MAN_INFO may be that of the most recent check-pointing information CP_INFO. The controller 130 may search for and retrieve the mandatory information MAN_INFO based on a method of sequentially searching from the page closest to an empty page of an open block to the page located farthest from the empty page of the open block. According to the prior art, since the selective information SEL_INFO and the mandatory information MAN_INFO are programmed in the memory block 502 in random order, the mandatory information MAN_INFO may not be stored in the page closest to the empty page of the open block 502. Therefore, it takes a long time to search for and retrieve the mandatory information MAN_INFO from the empty page of the open block 502 where the sudden power-off occurs.

Referring back to FIG. 5, when a sudden power-off occurs in the middle of programming the third selective information SEL_INFO3, the controller 130 may search for the mandatory information MAN_INFO by sequentially searching from a page 510 closest to the empty page EMPTY of the open block 502 to a page 540 located farthest from the empty page EMPTY of the open block 502. According to the prior art, since the selective information SEL_INFO and the mandatory information MAN_INFO are check-pointed in random order, the mandatory information MAN_INFO may not be stored in the page closest to the empty page EMPTY of the open block 502. Therefore, the controller 130 may end the searching process only after detecting the identifiers of the third selective information SEL_INFO3 and the second selective information SEL_INFO2 and then detecting the identifier of the mandatory information MAN_INFO.

Referring back to FIG. 4, in step S408, the controller 130 may control the memory device 150 to read the retrieved mandatory information MAN_INFO.

When the memory device 150 successfully reads the mandatory information MAN_INFO ('YES' in the step S408), in step S410, the controller 130 may control the memory device 150 to read the selective information SEL_INFO based on the read mandatory information MAN_INFO. For example, as described above, since the mandatory information MAN_INFO is the map data of the selective information SEL_INFO, the controller 130 may obtain address information of the selective information SEL_INFO from the read mandatory information MAN_INFO.

When the memory device 150 fails to read the mandatory information MAN_INFO ('NO' in the step S408), in step S416, the controller 130 may control the memory device 150 to resume the interrupted operation based on previous check-pointing information Previous CP_INFO, which is validly stored through the check-pointing operation performed before the latest check-pointing operation, through which the most recent check-pointing information CP_INFO is stored.

When the memory device 150 successfully reads the selective information SEL_INFO ('YES' in the step S412), the controller 130 may control the memory device 150 to resume the interrupted operation based on the most recent check-pointing information CP_INFO which is stored through the latest check-pointing operation performed in the step S402. When the memory device 150 fails to read the selective information SEL_INFO ('NO' in the step S412), in step S416, the controller 130 may control the memory device 150 to resume the interrupted operation based on the previous check-pointing information Previous CP_INFO.

According to the prior art, even though the mandatory information MAN_INFO is successfully read, the integrity of the selective information SEL_INFO may not be guaranteed. For this reason, an integrity checking operation has to be performed for checking whether the selective information SEL_INFO is successfully read according to the steps S410 and S412. Since the integrity checking operation of checking the integrity of the selective information SEL_INFO has to be performed even though all the information constituting the check-pointing information CP_INFO are successfully programmed, it takes a long time until the interrupted operation is resumed, which is problematic.

Referring back to FIG. 5, since the memory device 150 check-points the first to third selective information SEL_INFO1 to SEL_INFO3 and the mandatory information MAN_INFO in random order according to the prior art, the integrity of the second selective information SEL_INFO2 and the third selective information SEL_INFO3 may not be guaranteed even though the memory device 150 successfully reads the mandatory information MAN_INFO after a sudden power-off occurs. For example, when the memory device 150 successfully programs the mandatory information MAN_INFO and a sudden power-off occurs while programming the second selective information SEL_INF02, the memory device 150 may successfully read the mandatory information MAN_INFO. On the other hand, when the memory device 150 reads the second selective information SEL_INFO2 and the third selective information SEL_INFO3, a read failure may occur. Therefore, according to the prior art, even if the mandatory information MAN_INFO is successfully read after a sudden power-off occurs, the operation of checking the integrity of the selective information SEL_INFO may have to be performed additionally in order to check the integrity of all information constituting the check-pointing information CP_INFO, which is problematic.

Figure 6:
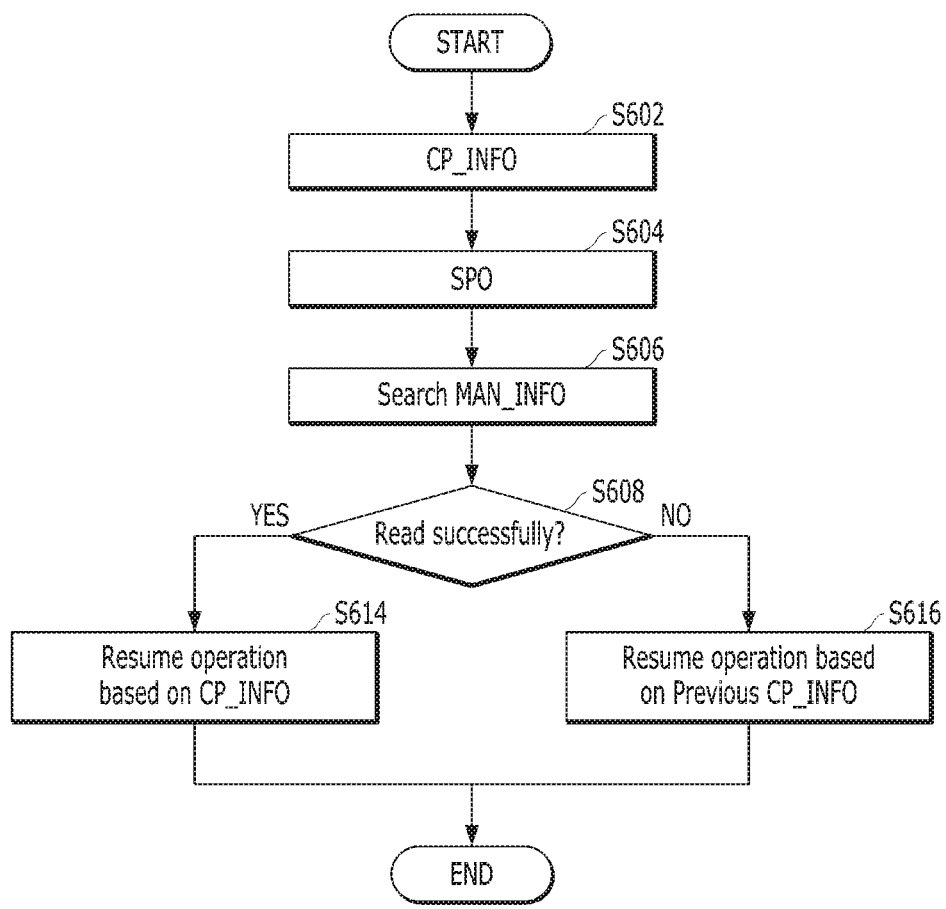
FIG. 6 is a flowchart describing a process of operating a memory system in accordance with an embodiment of the present invention.

FIG. 6 is a flowchart describing a process of operating the memory system 110 in accordance with an embodiment of the present invention.

In step S602, the controller 130 may control the memory device 150 to periodically perform a check-pointing operation. The controller 130 may perform a check-pointing operation by classifying the check-pointing information CP_INFO stored in the memory 144 into selective information SEL_INFO and mandatory information MAN_INFO, and then programming all the selective information SEL_INFO into a memory block and then programming the mandatory information MAN_INFO at the end.

Figure 7:
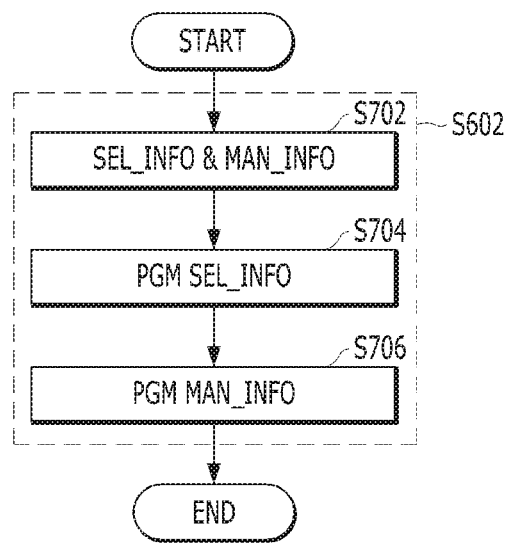
FIG. 7 is a flowchart describing in detail the check-pointing operation.

FIG. 7 is a flowchart describing detailed steps of the check-pointing operation.

The step S602 may include a step S702 of distinguishing the selective information SEL_INFO and the mandatory information MAN_INFO from each other, a step S704 of programming the selective information SEL_INFO, and a step S706 of programming the mandatory information MAN_INFO.

In step S702, the controller 130 may perform an operation of classifying the check-pointing information CP_INFO stored in the memory 144 into the selective information SEL_INFO and the mandatory information MAN_INFO. The controller 130 may perform the operation based on the identifiers stored in a separate space, e.g., a different memory block, inside the memory device 150. According to an embodiment of the present invention, the mandatory information MAN_INFO may be map information of the selective information SEL_INFO, and the controller 130 may control the memory device 150 to perform a background operation based on the selection information SEL_INFO and a foreground operation according to a request of the host 102.

In step S704, the controller 130 may control the memory device 150 to program the selective information SEL in a memory block during the check-pointing operation. The controller 130 may control the memory device 150 to perform a check-pointing operation on all the selective information SEL_INFO constituting the check-pointing information CP_INFO, among a plurality of selective information, based on the identifiers, and control the memory device 150 to perform the check-pointing operation in a random order.

In step S706, the controller 130 may check-point the mandatory information MAN_INFO after step S704 is completed. According to an embodiment of the present invention, since the controller 130 performs the check-pointing operation according to a method of programming the mandatory information MAN_INFO after programming the selective information SEL_INFO first, it may take a short time to search for and retrieve the mandatory information MAN_INFO after a sudden power-off occurs. When the mandatory information MAN_INFO is successfully read, the integrity of the selective information SEL_INFO may be guaranteed.

Figure 8:
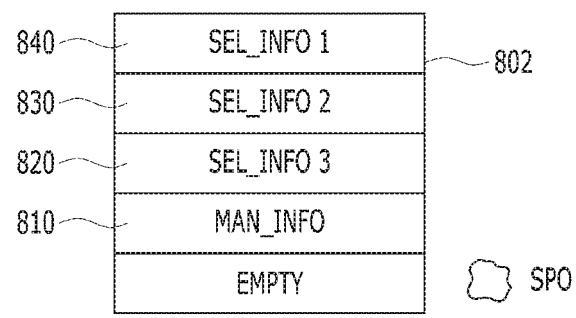
FIG. 8 illustrates a memory block for describing a check-pointing operation in accordance with an embodiment of the present invention.

FIG. 8 illustrates a memory block for describing a check-pointing operation in accordance with an embodiment of the present invention.

In the context of this description, and by way of example, the check-pointing information CP_INFO includes the first to third selective information SEL_INFO1 to SEL_INFO3 and the mandatory information MAN_INFO.

The controller 130 may perform a check-pointing operation of first programming the first to third selective information SEL_INFO1 to SEL_INFO3 and then programming the mandatory information MAN_INFO into a memory block 802. The memory block 802 illustrated in FIG. 8 may show a state in which the memory device 150 programs the first to third selective information SEL_INFO1 to SEL_INFO3 and the mandatory information MAN_INFO into the memory block 502 in order of the first to third selective information SEL_INFO1 to SEL_INFO3 and the mandatory information MAN_INFO.

Referring back to FIG. 6, in step S604, the controller 130 may sense a sudden power-off. When the sudden power-off occurs, the check-pointing information CP_INFO stored in the volatile memory 144 is lost when the power supply is resumed. On the other hand, the check-pointing information CP_INFO stored in the non-volatile memory block 802 may be retained after the power supply is resumed.

In step S606, the controller 130 may search for and retrieve the mandatory information MAN_INFO stored in the memory block. The controller 130 may search for and retrieve the mandatory information MAN_INFO of the most recent check-pointing information CP_INFO. As described above, the controller 130 may retrieve the mandatory information MAN_INFO by sequentially searching from the page closest to an empty page of an open block to the page located farthest from the empty page of the open block. According to an embodiment of the present invention, since the controller 130 may control the memory device 150 to program the mandatory information MAN_INFO after programming the selective information SEL_INFO, the mandatory information MAN_INFO of the check-pointing information CP_INFO may be programmed in the page closest to the empty page of the open block. Therefore, according to an embodiment of the present invention, the time taken for the controller 130 to search for and retrieve the mandatory information MAN_INFO after a sudden power-off may be shortened.

Referring back to FIG. 8, when a sudden power-off occurs after the mandatory information MAN_INFO is programmed, the controller 130 may retrieve the mandatory information MAN_INFO by sequentially searching from a page 810 closest to the empty page EMPTY of the open block 802 to a page 840 located farthest from the empty page EMPTY of the open block 802. According to an embodiment of the present invention, since the controller 130 controls the memory device 150 to perform a check-pointing operation onto the mandatory information MAN_INFO of the check-pointing information CP_INFO at the end, the controller 130 may quickly complete the retrieval by detecting the mandatory information MAN_INFO from the page 810 closest to the empty page EMPTY of the open block 802 without searching the pages 820 to 840 storing the first to third selective information SEL_INFO1 to SEL_INFO3.

Referring back to FIG. 6, in step S608, the controller 130 may control the memory device 150 to read the retrieved mandatory information MAN_INFO.

When the memory device 150 successfully reads the mandatory information MAN_INFO ('YES' in the step S608), in step S614, the controller 130 may control the memory device 150 to resume the interrupted operation based on the most recent check-pointing information CP_INFO which is stored through the latest check-pointing operation performed in the step S602.

When the memory device 150 fails to read the mandatory information MAN_INFO ('NO' in the step S608), in step S616, the controller 130 may control the memory device 150 to resume the interrupted operation based on previous check-pointing information Previous CP_INFO, which is validly stored through a check-pointing operation performed before to the latest check-pointing operation, through which the most recent check-pointing information CP_INFO is stored.

According to an embodiment of the present invention, the integrity of the mandatory information MAN_INFO may guarantee the integrity of the selective information SEL_INFO because the check-pointing operation is performed by first programming the selective information SEL_INFO and then programming the mandatory information MAN_INFO. Therefore, when the mandatory information MAN_INFO is successfully read after the occurrence of a sudden power-off, it may be regarded that the sudden power-off does not affect the check-pointing information CP_INFO including the successfully read mandatory information MAN_INFO without additionally performing an integrity checking operation for checking the integrity of the selective information SEL_INFO. Therefore, when the mandatory information MAN_INFO is successfully read after the sudden power-off occurs, the controller 130 may control the memory device 150 to resume the interrupted operation directly based on the check-pointing information CP_INFO. In this way, the interrupted operation may be resumed quickly.

Figure 9:
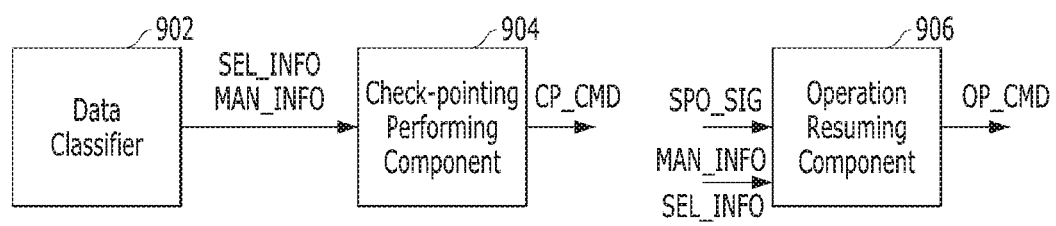
FIG. 9 is a block diagram of a memory system in accordance with an embodiment of the present invention.

FIG. 9 is a block diagram of the memory system 110 in accordance with an embodiment of the present invention. FIG. 9 schematically shows constituent elements related to the present invention in the data processing system 100 of FIG. 1.

The processor 134 described above with reference to FIG. 1 may include the data classifier 902, the check-pointing component 904, and the operation resuming component 906.

The data classifier 902 may classify the check-pointing information CP_INFO stored in the memory 144 into the selective information SEL_INFO and the mandatory information MAN_INFO. The data classifier 902 may perform the operation based on the identifiers stored in a separate space, e.g., a different memory block, inside the memory device 150. According to an embodiment of the present invention, the mandatory information MAN_INFO may be map information of the selective information SEL_INFO, and the selective information SEL_INFO may be information for the memory device 150 to perform a background operation or a foreground operation according to a request of the host 102. The data classifier 902 may provide the check-pointing component 904 with the selective information SEL_INFO and the mandatory information MAN_INFO.

The check-pointing component 904 may control the memory device 150 to perform a check-pointing operation onto the provided selective information SEL_INFO and mandatory information MAN_INFO. During the check-pointing operation, the check-pointing component 904 may control the memory device 150 to perform a check-pointing operation on all the selective information SEL_INFO constituting the check-pointing information CP_INFO at each check-pointing time, and then perform a check-pointing operation on the mandatory information MAN_INFO by providing check pointing command CP_CMD to the memory device 150. According to an embodiment of the present invention, the check-pointing component 904 may control the memory device 150 to check-point the selective information SEL_INFO and the mandatory information MAN_INFO in one super memory block, thereby improving the speed of the check-pointing operation.

Figure 10:
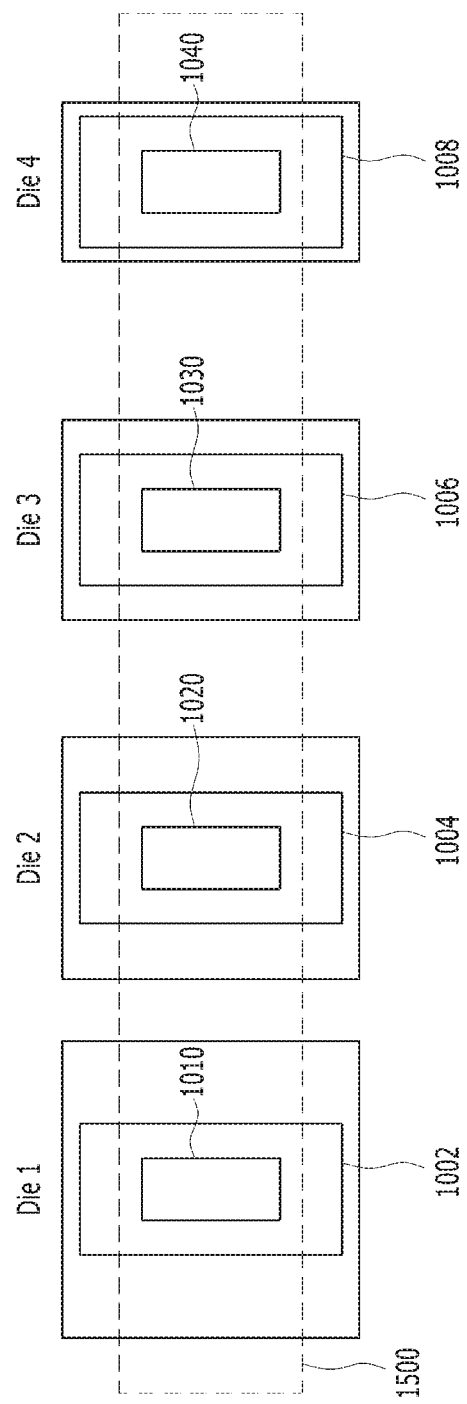
FIG. 10 illustrates a check-pointing operation of check-pointing selective information and mandatory information in one super memory block in accordance with an embodiment of the present invention.

FIG. 10 illustrates a check-pointing operation of check-pointing selective information SEL_INFO and mandatory information MAN_INFO in one super memory block in accordance with an embodiment of the present invention.

As described above with reference to FIG. 2, there are various methods of grouping and managing memory blocks on the basis of a super memory block. In the embodiment of FIG. 10, the memory device 150 includes first to fourth memory dies DIE1 to DIE4, and each of the first to fourth memory dies DIE1 to DIE4 includes one plane. Also, in connection with the illustrated embodiment, the check-pointing information CP_INFO includes the first to third selective information SEL_INFO1 to SEL_INFO3 and mandatory information MAN_INFO.

The controller 130 may put one arbitrary memory block 1010 in a plane 1002 of the first memory die DIE1, one arbitrary memory block 1020 in a plane 1004 of the second memory die DIE2, one arbitrary memory block 1030 in a plane 1006 of the third memory die DIE3, and one arbitrary memory block 1040 in a plane 1008 of the fourth memory die DIE4 into one group, and manage them as one super memory block 1500.

The check-pointing component 904 may control the memory device 150 to check-point the first to third selective information SEL_INFO1 to SEL_INFO3 and the mandatory information MAN_INFO into the one super memory block 1500. The memory device 150 may program the first selective information SEL_INFO1 into the memory block 1010 in the first memory die DIE1, program the second selective information SEL_INF02 into the memory block 1020 in the second memory die DIE1, and program the third selective information SEL_INFO3 into the memory block 1030 in the third memory die DIE3 under the control of the check-pointing component 904. According to an embodiment of the present invention, the check-pointing component 904 may improve the speed of the program operation by controlling the memory device 150 to check-point the first to third selective information SEL_INFO1 to SEL_INFO3 into one super memory block 1500 according to an interleaving scheme. When the check-pointing operation performed on the first to third selective information SEL_INFO1 to SEL_INFO3 is completed, the check-pointing component 904 may program the mandatory information MAN_INFO into the memory block 1040 in the fourth memory die DIE4.

Referring back to FIG. 9, when sudden power-off occurs, a sudden power off signal SPO_SIG is provided to the operation resuming component 906 from sudden power-off sensing component (not shown). The operation resuming component 906 may check the integrity of the check-pointing information CP_INFO which is check-pointed and control the memory device 150 to resume the interrupted operation by providing operation command CP_CMD to the memory device 150. The operation resuming component 906 may search for and retrieve the mandatory information MAN_INFO stored in the memory block and control the memory device 150 to read the mandatory information MAN_INFO. When the mandatory information MAN_INFO is successfully read after the sudden power-off, the operation resuming component 906 may control the memory device 150 to resume the interrupted operation based on the check-pointing information CP_INFO. When the operation of reading the mandatory information MAN_INFO failed, the operation resumption component 906 may control the memory device 150 to resume the interrupted operation based on the check-pointing information obtained from the previous check-pointing operation.

Figure 11:
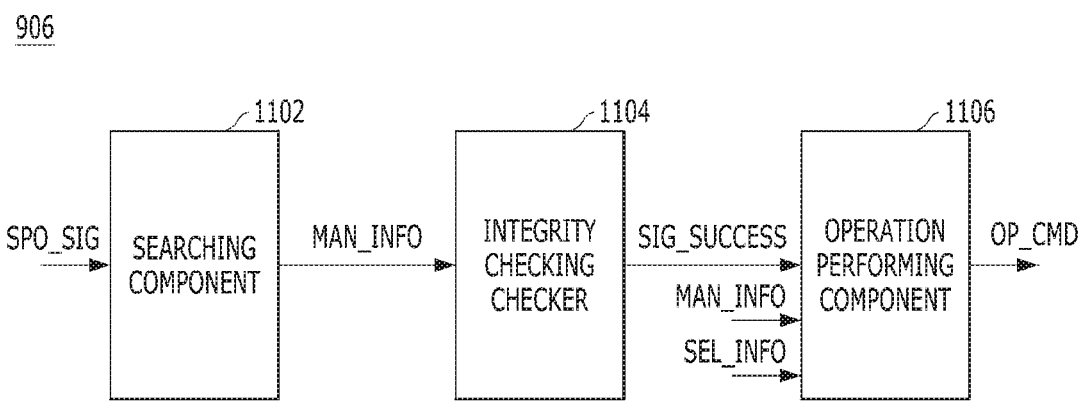
FIG. 11 is a block diagram illustrating constituent elements of an operation resuming component.

FIG. 11 is a block diagram illustrating constituent elements of the operation resuming component 906.

The operation resuming component 906 may include a search component 1102, an integrity checker 1104, and an operation performing component 1106.

The search component 1102 may search for and retrieve the mandatory information MAN_INFO stored in a memory block when the sudden power off signal SPO_SIG is provided. The search component 1102 may search for the mandatory information MAN_INFO in the most recent check-pointing information CP_INFO, which is stored through the latest check-pointing operation. The search component 1102 may retrieve the mandatory information MAN_INFO by sequentially searching from the page closest to the empty page of the open block to the page located farthest from the empty page. According to an embodiment of the present invention, since the check-pointing component 904 controls the memory device 150 to program the mandatory information MAN_INFO after the memory device 150 programs the selective information SEL_INFO, the mandatory information MAN_INFO of the check-pointing information CP_INFO may be stored in the page closest to the empty page of the open block. Therefore, according to an embodiment of the present invention, the time required for the search component 1102 to search for and retrieve the mandatory information MAN_INFO after a sudden power-off may be shortened. The search component 1120 may provide the integrity checker 1104 with the retrieved mandatory information MAN_INFO.

The integrity checker 1104 may control the memory device 150 to read the retrieved mandatory information MAN_INFO. When the mandatory information MAN_INFO is successfully read, the integrity checker 1104 may provide the operation performing component 1106 with a success signal SIG_SUCCESS. When the operation of reading the mandatory information MAN_INFO failed, the integrity checker 1104 may read the previous check-pointing information obtained from the immediately previous check-pointing operation and provide the operation performing component 1106 with the previous check-pointing information along with a failure signal SIG_FAIL.

The operation performing component 1106 may control the memory device 150 to resume the interrupted operation based on the most recent check-pointing information CP_INFO provided along with the success signal SIG_SUCCESS. The operation performing component 1106 may control the memory device 150 to resume the interrupted operation based on the check-pointing information obtained from the immediately previous check-pointing operation, according to the provided failure signal SIG_FAIL.

A memory device in a memory system in accordance with embodiments of the present invention is described in more detail with reference to FIGS. 12 to 14.

Figure 12:
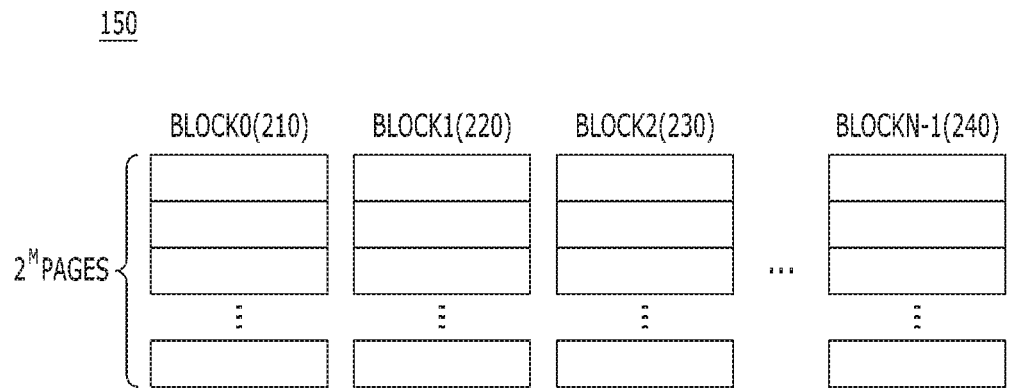
FIG. 12 is a schematic diagram illustrating a configuration of a memory device such as that employed in the memory system shown in FIG. 1.

FIG. 12 is a schematic diagram illustrating a memory device, e.g., the memory device 150. FIG. 13 is a circuit diagram illustrating a configuration of a memory cell array of a memory block 330 in the memory device 150. FIG. 14 is a schematic diagram illustrating a 3D structure of the memory device 150.

Referring to FIG. 12, the memory device 150 may include a plurality of memory blocks BLOCK0 (210) to BLOCKN−1 (240), where N is an integer greater than 1. Each of the blocks BLOCK0 to BLOCKN−1 may include a plurality of pages, for example, $2^M$ or M pages, the number of which may vary according to circuit design, M being an integer greater than 1. Each of the pages may include a plurality of memory cells that are coupled to a plurality of word lines WL.

Also, memory cells in the respective memory blocks BLOCK0 to BLOCKN−1 may be one or more of a single level cell (SLC) memory block storing 1-bit data or a multi-level cell (MLC) memory block storing 2-bit data. Hence, the memory device 150 may include SLC memory blocks or MLC memory blocks, depending on the number of bits which can be expressed or stored in each of the memory cells in the memory blocks. The SLC memory blocks may include a plurality of pages which are embodied by memory cells, each storing one-bit data. The SLC memory blocks may generally have higher data computing performance and higher durability than the MLC memory blocks. The MLC memory blocks may include a plurality of pages which are embodied by memory cells each storing multi-bit data (for example, 2 or more bits). The MLC memory blocks may generally have larger data storage space, that is, higher integration density, than the SLC memory blocks. In another embodiment, the memory device 150 may include a plurality of triple level cell (TLC) memory blocks. In yet another embodiment, the memory device 150 may include a plurality of quadruple level cell (QLC) memory blocks. The TCL memory blocks may include a plurality of pages which are embodied by memory cells each capable of storing 3-bit data. The QLC memory blocks may include a plurality of pages which are embodied by memory cells each capable of storing 4-bit data.

Instead of a nonvolatile memory, the memory device 150 may be implemented by any one of a phase change random access memory (PCRAM), a resistive random access memory (RRAM(ReRAM)), a ferroelectrics random access memory (FRAM), and a spin transfer torque magnetic random access memory (STT-RAM(STT-M RAM)).

The memory blocks 210, 220, 230, 240 may store the data transferred from the host 102 through a program operation, and may transfer data stored therein to the host 102 through a read operation.

Figure 13:
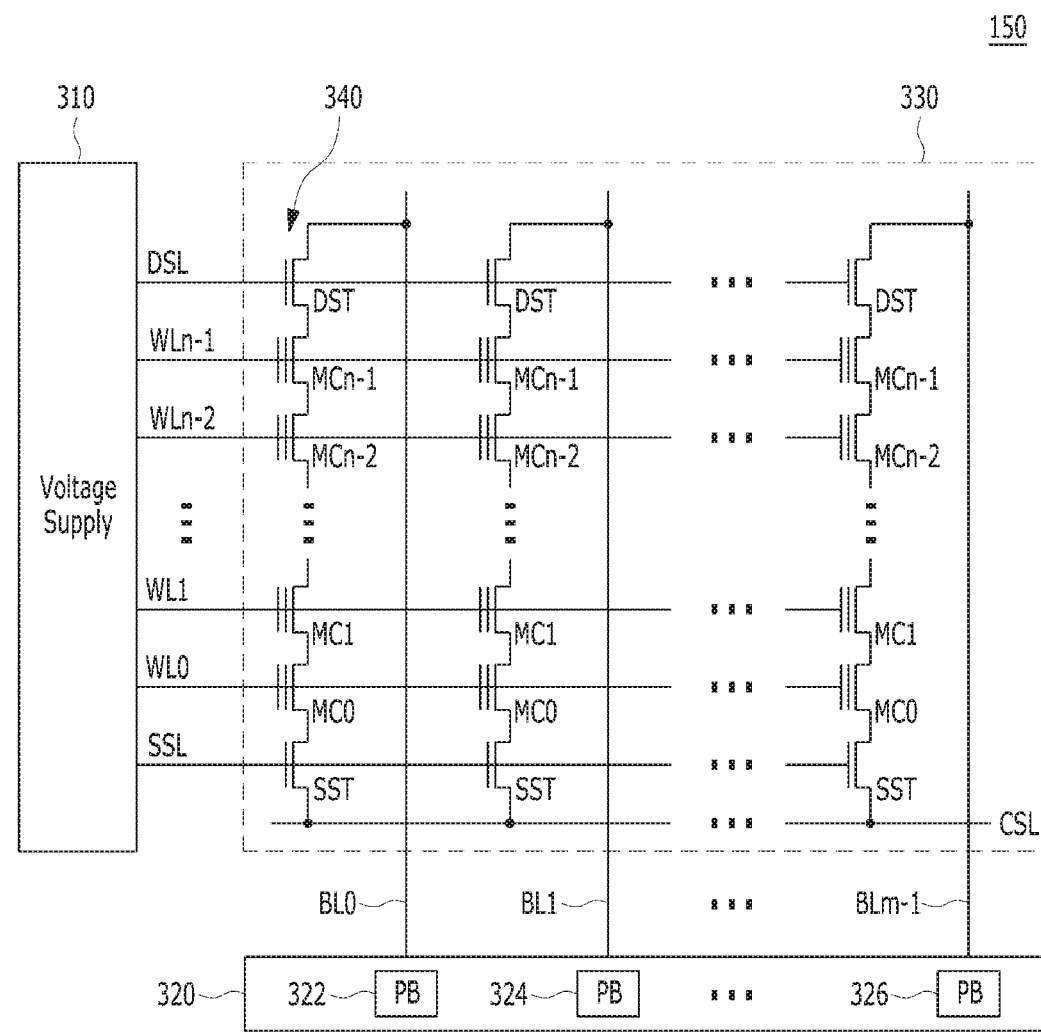
FIG. 13 is a circuit diagram illustrating a configuration of a memory cell array of a memory block in a memory device such as that shown in FIG. 1.
Figure 14:
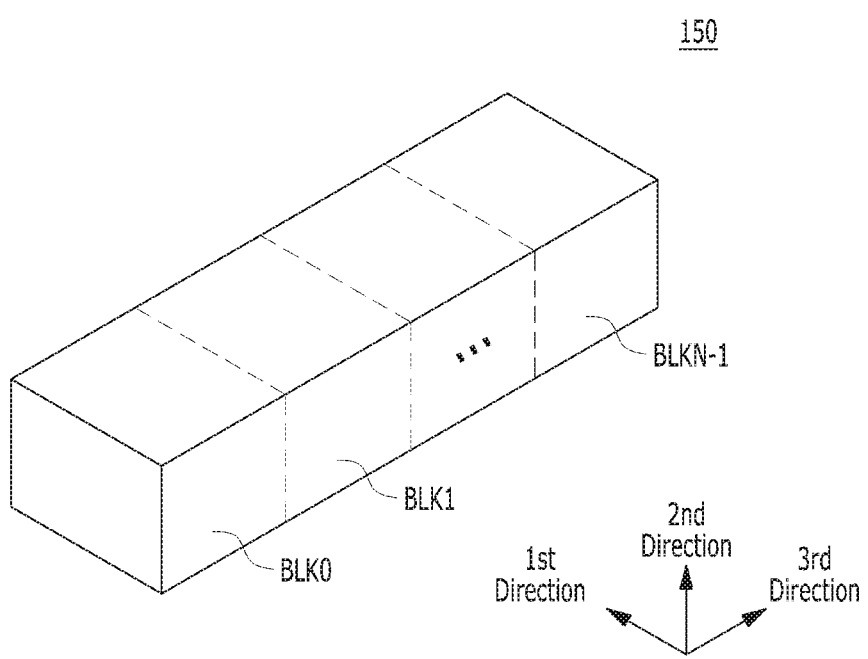
FIG. 14 is a block diagram illustrating a structure of a memory device of a memory system in accordance with an embodiment of the present invention.

Referring to FIG. 13, the memory block 330 may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 13, the first cell string is coupled to the first bit line BL0, and the last cell string is coupled to the last bit line BLm−1.

Although FIG. 13 illustrates NAND flash memory cells, the present disclosure is not limited thereto. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which generates different word line voltages including a program voltage, a read voltage, and a pass voltage to supply to the word lines according to an operation mode. The voltage generation operation of the voltage supply 310 may be controlled by a control circuit (not illustrated). Under the control of the control circuit, the voltage supply 310 may select at least one of the memory blocks (or sectors) of the memory cell array, select at least one of the word lines of the selected memory block, and provide the word line voltages to the selected word line(s) and the unselected word lines as may be needed.

The memory device 150 may include a read/write circuit 320 which is controlled by the control circuit. During a verification/normal read operation, the read/write circuit 320 may operate as a sense amplifier for reading (sensing and amplifying) data from the memory cell array. During a program operation, the read/write circuit 320 may operate as a write driver for supplying a voltage or a current to bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

The memory device 150 may be embodied by a 2D or 3D memory device. Particularly, as illustrated in FIG. 14, the memory device 150 may be embodied by a nonvolatile memory device having a 3D stack structure. When the memory device 150 has a 3D structure, the memory device 150 may include a plurality of memory blocks BLK0 to BLKN−1. Herein, FIG. 14 is a block diagram illustrating the memory blocks 152, 154 and 156 of the memory device 150 shown in FIG. 1. Each of the memory blocks 152, 154 and 156 may be realized in a 3D structure (or vertical structure). For example, the memory blocks 152, 154 and 156 may individually and collectively be a three-dimensional structure with dimensions extending in first to third directions, e.g., an x-axis direction, a y-axis direction, and a z-axis direction.

Each memory block 330 included in the memory device 150 may include a plurality of NAND strings NS that are extended in the second direction, and a plurality of NAND strings NS that are extended in the first direction and the third direction. Herein, each of the NAND strings NS may be coupled to a bit line BL, at least one string selection line SSL, at least one ground selection line GSL, a plurality of word lines WL, at least one dummy word line DWL, and a common source line CSL, and each of the NAND strings NS may include a plurality of transistor structures TS.

In short, each memory block 330 among the memory blocks 152, 154 and 156 of the memory device 150 may be coupled to a plurality of bit lines BL, a plurality of string selection lines SSL, a plurality of ground selection lines GSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a string selection transistor SST of each NAND string NS may be coupled to a corresponding bit line BL, and a ground selection transistor GST of each NAND string NS may be coupled to a common source line CSL. Herein, memory cells MC may be provided between the string selection transistor SST and the ground selection transistor GST of each NAND string NS. In other words, a plurality of memory cells may be realized in each memory block 330 of the memory blocks 152, 154 and 156 of the memory device 150.

Hereafter, a data processing system and electronic devices to which the memory system 110 including the memory device 150 and the controller 130, which are described above, in accordance with embodiments of the present invention will be described in detail with reference to FIGS. 15 to 23.

Figure 15:
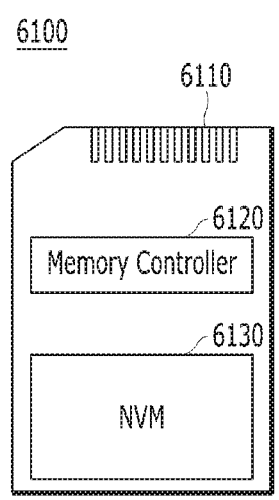
FIGS. 15 to 23 are diagrams schematically illustrating applications of the data processing system in accordance with various embodiments of the present invention.

FIG. 15 is a diagram schematically illustrating another example of the data processing system including the memory system in accordance with an embodiment. FIG. 15 schematically illustrates a memory card system to which the memory system may be applied.

Referring to FIG. 15, the memory card system 6100 may include a memory controller 6120, a memory device 6130 and a connector 6110.

More specifically, the memory controller 6120 may be electrically connected to, and configured to access, the memory device 6130 embodied by a nonvolatile memory. For example, the memory controller 6120 may be configured to control read, write, erase and background operations of the memory device 6130. The memory controller 6120 may be configured to provide an interface between the memory device 6130 and a host, and to use firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a RAM, a processor, a host interface, a memory interface and an error correction component.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system may be applied to wired/wireless electronic devices including mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device to form a solid-state driver (SSD). Also, the memory controller 6120 and the memory device 6130 may be so integrated to form a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC), and/or a universal flash storage (UFS).

Figure 16:
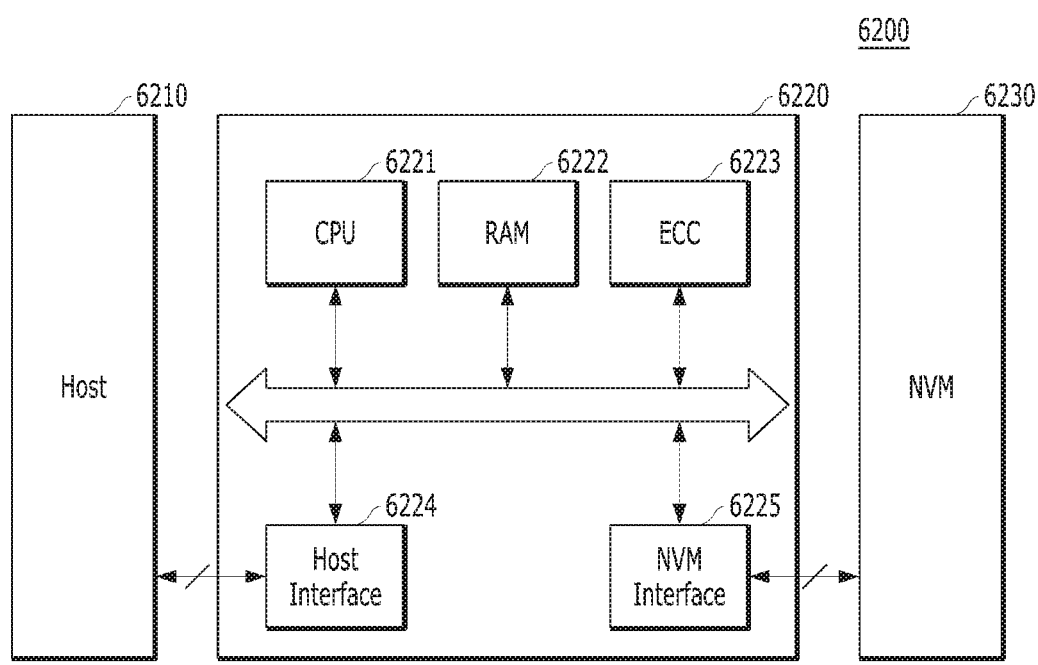

FIG. 16 is a diagram schematically illustrating another example of the data processing system including the memory system in accordance with an embodiment.

Referring to FIG. 16, the data processing system 6200 may include a memory device 6230 having one or more nonvolatile memories and a memory controller 6220 for controlling the memory device 6230. The data processing system 6200 illustrated in FIG. 16 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the memory device 6230 to operate at high speed.

The ECC circuit 6223 may generate an ECC (Error Correction Code) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. The ECC circuit 6223 may correct an error using the LDPC code, BCH code, turbo code, Reed-Solomon code, convolution code, RSC or coded modulation such as TCM or BCM.

The memory controller 6220 may exchange data with the host 6210 through the host interface 6224. The memory controller 6220 may exchange data with the memory device 6230 through the NVM interface 6225. The host interface 6224 may be connected to the host 6210 through a PATA bus, a SATA bus, a SCSI, an USB, a PCIe or a NAND interface. The memory controller 6220 may have a wireless communication function with a mobile communication protocol such as WiFi or Long Term Evolution (LTE). The memory controller 6220 may be connected to an external device, for example, the host 6210 or another external device, and then exchange data with the external device. In particular, as the memory controller 6220 is configured to communicate with the external device according to one or more of various communication protocols, the memory system and the data processing system may be applied to wired/wireless electronic devices, particularly a mobile electronic device.

Figure 17:
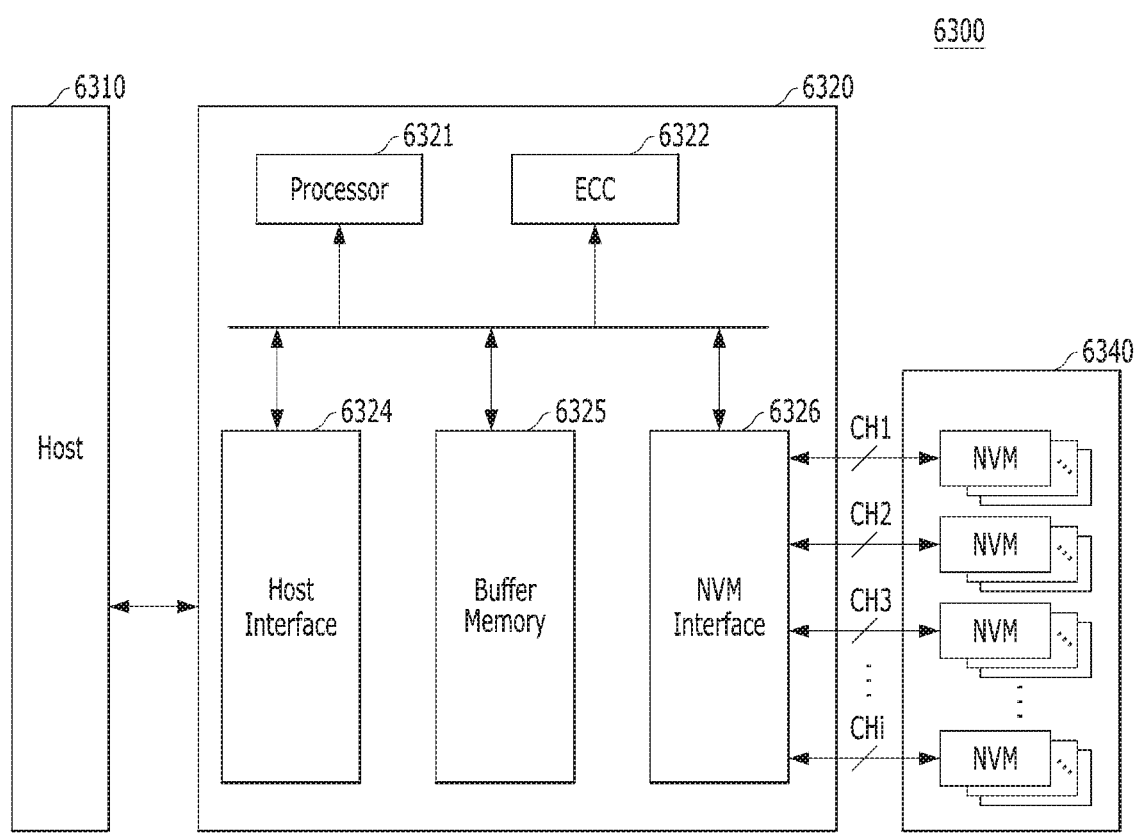

FIG. 17 is a diagram schematically illustrating another example of the data processing system including the memory system in accordance with an embodiment. FIG. 17 schematically illustrates an SSD to which the memory system may be applied.

Referring to FIG. 17, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340. Further, the buffer memory 6325 may temporarily store meta data of the plurality of flash memories NVM, for example, map data including a mapping table. The buffer memory 6325 may be embodied by any of a variety of volatile memories such as a DRAM, a SDRAM, a DDR SDRAM, a LPDDR SDRAM and a GRAM or nonvolatile memories such as a FRAM, a ReRAM, a STT-MRAM and a PRAM. FIG. 17 illustrates that the buffer memory 6325 is embodied in the controller 6320. However, the buffer memory 6325 may be external to the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 may be applied may be provided to embody a data processing system, for example, a RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 18:
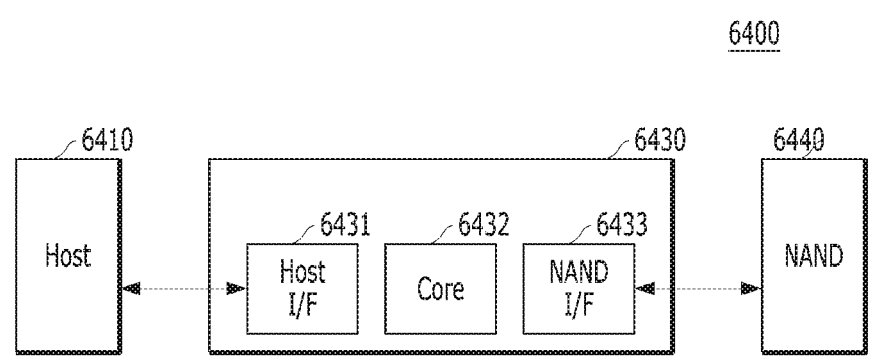

FIG. 18 is a diagram schematically illustrating another example of the data processing system including the memory system in accordance with an embodiment. FIG. 18 schematically illustrates an embedded Multi-Media Card (eMMC) to which the memory system may be applied.

Referring to FIG. 18, the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 19 to 22 are diagrams schematically illustrating other examples of the data processing system including the memory system in accordance with embodiments. FIGS. 19 to 22 schematically illustrate UFS (Universal Flash Storage) systems to which the memory system may be applied.

Referring to FIGS. 19 to 22, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices or particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices or particularly mobile electronic devices through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 16 to 18, and the UFS cards 6530, 6630, 6730, 6830 may be embodied in the form of the memory card system 6100 described with reference to FIG. 15.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through any of various protocols other than the UFS protocol, for example, an UFDs, a MMC, a SD, a mini-SD, and a micro-SD.

Figure 19:
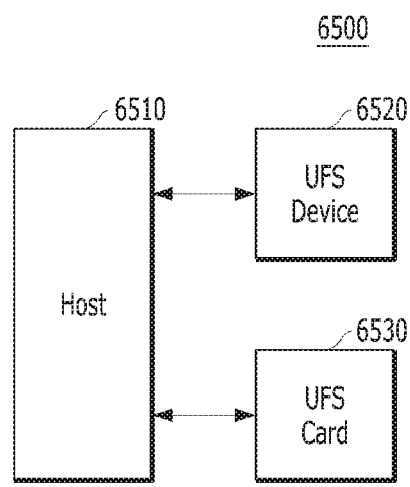

In the UFS system 6500 illustrated in FIG. 19, each of the host 6510, the UFS device 6520 and the UFS card 6530 may include UniPro. The host 6510 may perform a switching operation to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the illustrated embodiment, one UFS device 6520 and one UFS card 6530 are connected to the host 6510. However, a plurality of UFS devices and UFS cards may be connected in parallel or in the form of a star to the host 6410. A star formation is an arrangement in which a single device is coupled with plural devices for centralized operation. A plurality of UFS cards may be connected in parallel or in the form of a star to the UFS device 6520 or connected in series or in the form of a chain to the UFS device 6520.

Figure 20:
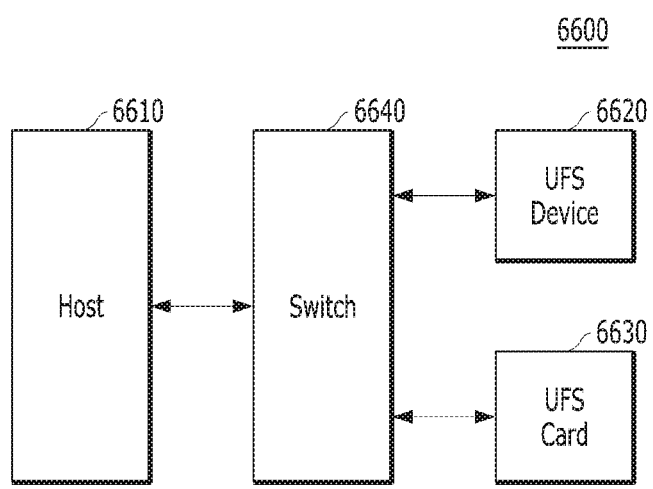

In the UFS system 6600 illustrated in FIG. 20, each of the host 6610, the UFS device 6620 and the UFS card 6630 may include UniPro. The host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the illustrated embodiment, one UFS device 6620 and one UFS card 6630 are connected to the switching module 6640. However, a plurality of UFS devices and UFS cards may be connected in parallel or in the form of a star to the switching module 6640. A plurality of UFS cards may be connected in series or in the form of a chain to the UFS device 6620.

Figure 21:
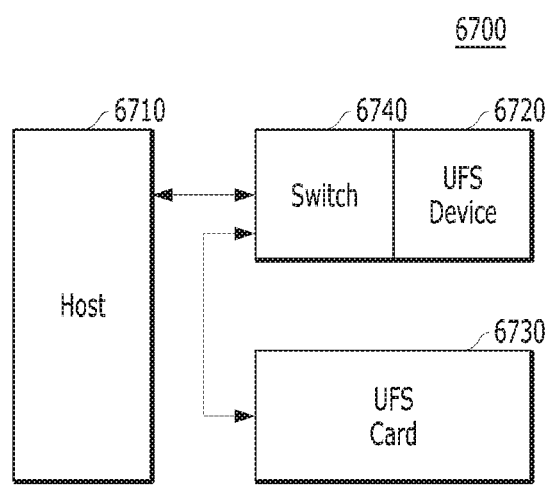

In the UFS system 6700 illustrated in FIG. 21, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720. In the illustrated embodiment, one UFS device 6720 and one UFS card 6730 are connected to the switching module 6740. However, a plurality of modules, each including the switching module 6740 and the UFS device 6720, may be connected in parallel or in the form of a star to the host 6710. In another example, a plurality of modules may be connected in series or in the form of a chain to each other. Furthermore, a plurality of UFS cards may be connected in parallel or in the form of a star to the UFS device 6720.

Figure 22:
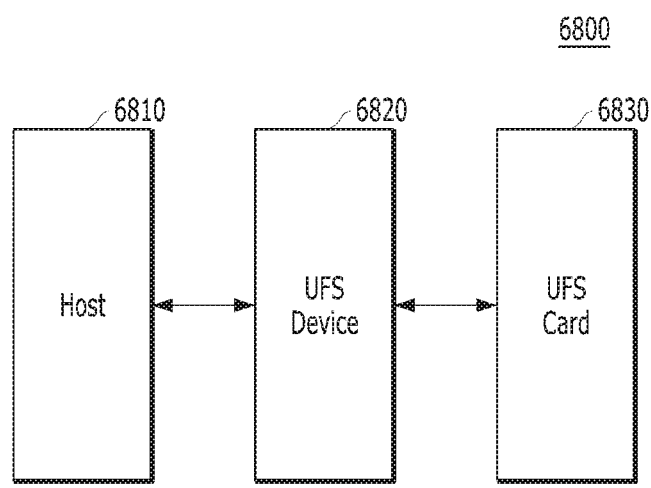

In the UFS system 6800 illustrated in FIG. 22, each of the host 6810, the UFS device 6820 and the UFS card 6830 may include M-PHY and UniPro. The UFS device 6820 may perform a switching operation to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the illustrated embodiment, one UFS device 6820 is connected to the host 6810 and one UFS card 6830 is connected to the UFS device 6820. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 23:
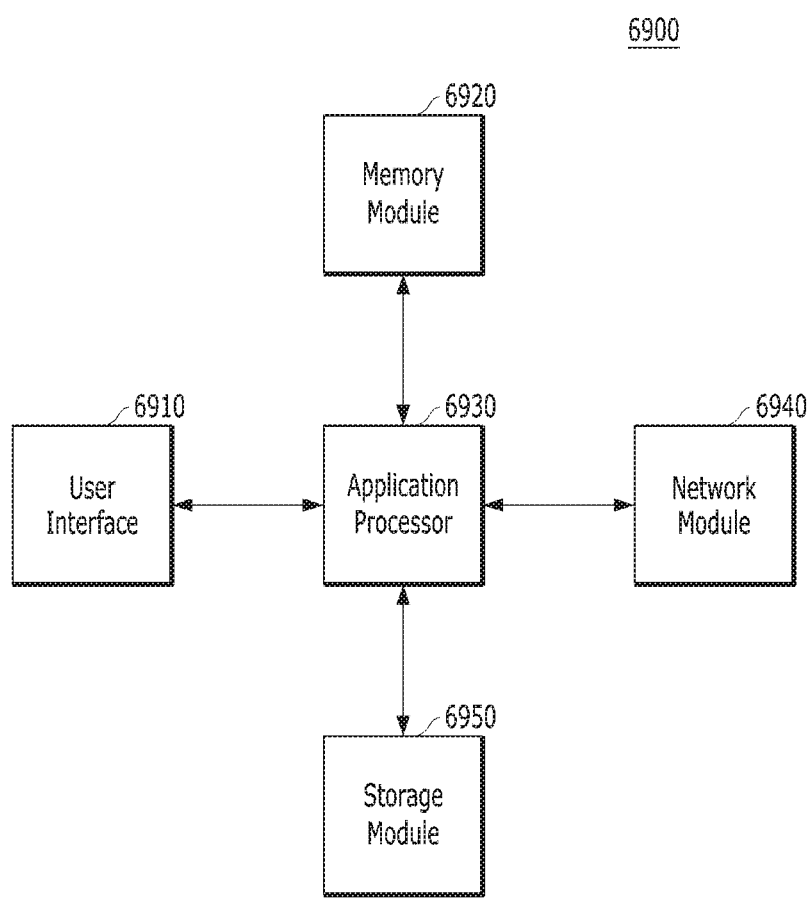

FIG. 23 is a diagram schematically illustrating another example of the data processing system including the memory system in accordance with an embodiment of the present invention. FIG. 23 is a diagram schematically illustrating a user system to which the memory system may be applied.

Referring to FIG. 23, the user system 6900 may include an application processor 6930, a memory module 6920, a network module 6940, a storage module 6950 and a user interface 6910.

More specifically, the application processor 6930 may drive components in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as a DRAM, a SDRAM, a DDR SDRAM, a DDR2 SDRAM, a DDR3 SDRAM, a LPDDR SDARM, a LPDDR3 SDRAM or a LPDDR3 SDRAM or a nonvolatile RAM such as a PRAM, a ReRAM, a MRAM or a FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1.

Furthermore, the storage module 6950 may be embodied as an SSD, an eMMC and an UFS as described above with reference to FIGS. 17 to 22.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to embodiments of the present invention, after a sudden power-off, the memory system may quickly resume an operation that is suspended or interrupted due to the sudden power-off.

While the present invention has been illustrated and described with respect to the specific embodiments, it will be apparent to those skilled in the art in light of the present disclosure that various changes and modifications may be made without departing from the spirit and scope of the present disclosure as defined in the following claims.

What is claimed is:

1. A memory system, comprising:
a memory device including a plurality of memory blocks; and
a controller configured to:
use an identifier for classifying check-pointing information into selective information and mandatory information;
program the selective information identified by the identifier in at least one memory block among the plurality of memory blocks;
program the mandatory information identified by the identifier, following the selective information in the at least one memory block; and
retrieve the mandatory information prior to the selective information during a resuming operation.

2. The memory system of claim 1, wherein the controller comprises an operation resuming component configured to perform the resuming operation, which is interrupted due to a sudden power-off, based on the check-pointing information programmed in the memory block when the sudden power-off occurs.

3. The memory system of claim 1, wherein the controller comprises a check-pointing component configured to program the selective information and the mandatory information into one super block in an interleaving scheme.

4. The memory system of claim 1, wherein the controller comprises a data classifier configured to perform a data classifying operation based on the identifier.

5. The memory system of claim 2, wherein, when the sudden power-off occurs, the operation resuming component performs an integrity checking operation of checking integrity of the mandatory information by retrieving and reading the mandatory information.

6. The memory system of claim 5, wherein, when the mandatory information is successfully read, the operation resuming component resumes the interrupted operation based on the check-pointing information including the mandatory information.

7. The memory system of claim 1, wherein the selective information is for performing a background operation or an operation according to a request.

8. The memory system of claim 3, wherein the check-pointing component programs the mandatory information after the selective information is programmed.

9. The memory system of claim 1, wherein the mandatory information is map information for the selective information.

10. The memory system of claim 1, wherein the controller comprises a volatile memory configured to temporarily store the check-pointing information before the controller programs the check-pointing information in the memory device.

11. A method for operating a memory system, comprising:
using an identifier for classifying check-pointing information into selective information and mandatory information;
programming the selective information identified by the identifier in at least one memory block among a plurality of memory blocks;
programming the mandatory information identified by the identifier, following the selective information in the at least one memory block; and
retrieving the mandatory information prior to the selective information during a resuming operation.

12. The method of claim 11, wherein the resuming operation comprises:
resuming an operation which is interrupted due to a sudden power-off based on the check-pointing information programmed in the memory block when the sudden power-off occurs.

13. The method of claim 11, wherein
the selective information and the mandatory information are programmed into one super block in an interleaving scheme.

14. The method of claim 12, wherein the resuming operation includes, when the sudden power-off occurs, performing an integrity checking operation of checking integrity of the mandatory information by retrieving and reading the mandatory information.

15. The method of claim 14, wherein the interrupted operation is resumed based on the check-pointing information including the mandatory information.

16. The method of claim 11, wherein the selective information is for performing a background operation or an operation according to a request.

17. The method of claim 13, wherein the mandatory information is programmed after the selective information is programmed.

18. The method of claim 11, wherein the mandatory information is map information for the selective information.

19. The method of claim 11, wherein the check-pointing information is temporarily stored in a volatile memory before programmed in at least one memory block.

\* \* \* \* \*